United States Patent
van Berkel

(10) Patent No.: US 7,109,726 B2
(45) Date of Patent: Sep. 19, 2006

(54) OBJECT SENSING

(75) Inventor: Cornelis van Berkel, Hove (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 429 days.

(21) Appl. No.: 10/197,652

(22) Filed: Jul. 17, 2002

(65) Prior Publication Data

US 2003/0021078 A1 Jan. 30, 2003

(30) Foreign Application Priority Data

Jul. 25, 2001 (GB) .......................... 0118086.8
Jun. 7, 2002 (GB) .......................... 0213240.5

(51) Int. Cl.
*G01R 27/26* (2006.01)

(52) U.S. Cl. ............... 324/661; 324/658; 324/663; 324/687; 382/124

(58) Field of Classification Search ........... 324/661, 324/663, 671, 664, 627, 658, 689; 382/124–127, 382/115, 116
See application file for complete search history.

(56) References Cited

U.S. PATENT DOCUMENTS

| | | | |
|---|---|---|---|
| 4,878,553 A | 11/1989 | Yamanami et al. | 178/18 |
| 5,231,381 A | 7/1993 | Duwaer | 340/712 |
| 5,844,415 A | 12/1998 | Gershenfeld et al. | 324/663 |
| 5,936,412 A * | 8/1999 | Gershenfeld et al. | 324/663 |
| 5,948,031 A | 9/1999 | Jinno et al. | 701/45 |
| 5,963,679 A | 10/1999 | Setlak | 382/312 |
| 6,025,726 A | 2/2000 | Gershenfeld et al. | 324/671 |
| 6,069,970 A | 5/2000 | Salatino et al. | 382/124 |
| 6,512,381 B1 * | 1/2003 | Kramer | 324/658 |

FOREIGN PATENT DOCUMENTS

| | | |
|---|---|---|
| EP | 1043850 | 10/2000 |
| WO | WO9424645 | 10/1994 |

* cited by examiner

*Primary Examiner*—Minh H Chau

(57) ABSTRACT

A combined passive and active object sensing system (30; 50; 70) employing electric field sensing is described. An electric field sensing transmission electrode (2) generates a first electric field (11, 12, 13) that induces a current in an electric field sensing reception electrode (4). A passive object (10) is sensed from variation in this current. An active object (31; 51; 71) comprises a further electric field sensing transmission electrode (33; 53; 73) and generates a second electric field (35, 36, 37; 55, 56, 57; 75, 76, 77). This may be generated by the active object (31) coupling with and applying a phase shift to the first electric field (11, 12, 13). Alternatively the second electric field (55, 56, 57) may be generated at a different frequency to the first electric field (11, 12, 13). Alternatively the second electric field (75, 76, 77) may be generated by the active object (71) coupling with an alternating magnetic field generated by a coil (172). The second electric field (35, 36, 37; 55, 56, 57; 75, 76, 77) induces a current in the electric field sensing reception electrode (4) that varies with the position of the active object (31; 51; 71). The separate currents are distinguished by virtue of their different phase or frequency.

21 Claims, 6 Drawing Sheets

OBJECT SENSING

DESCRIPTION

The present invention relates to object sensing using electric field sensing. Electric field sensing is also known as quasi-electrostatic sensing.

Sensing technologies used for object sensing include capacitive sensing and electric field sensing, also known as quasi-electrostatic sensing, and which may be termed cross capacitive sensing. The use of electric field sensing to detect objects in 3-D space has been known for a long while, and is used for example in proximity sensors. In nature, the gnathomenu petersii fish uses electric field sensing to detect objects. In its very simplest form, capacitive sensing uses just one electrode and a measurement is made of the load capacitance of that electrode. This load capacitance is determined by the sum of all the capacitances between the electrode and all the grounded objects around the electrode. This is what is done in proximity sensing. Electric field sensing, which may be termed cross capacitance sensing, uses two electrodes, and effectively measures the specific capacitance between the two electrodes. The electrode to which electric field generating apparatus is connected may be considered to be an electric field sensing transmission electrode, and the electrode to which measuring apparatus is connected may be considered to be an electric field sensing reception electrode. The first (transmitting) electrode is excited by application of an alternating voltage. A displacement current is thereby induced in the second (receiving) electrode due to capacitive coupling between the electrodes (i.e. effect of electric field lines). If an object is placed near the electrodes (i.e. in the field lines) some of the field lines are terminated by the object and the capacitive current decreases. If the current is monitored, the presence of the object may be sensed.

U.S. Pat. No. 6,025,726 discloses use of an electric field sensing arrangement as, inter-alia, a user input device for computer and other applications. The electric field sensing arrangement senses the position of a user's finger(s), hand or whole body, depending on the intended application.

An advantage of electric field sensing is that it can be used to detect electrically passive objects.

Quite separately, other types of sensing technology rely on the use of specially prepared "active" objects. One example is a so-called "electromagnetic pen" in which an inductor-capacitor resonant circuit in a "pen" device interacts by electromagnetic coupling with magnetic field loops forming a tablet. The position of the pen (object) relative to the tablet is sensed, by again using electromagnetic coupling into loops at the tablet, sometimes the same loops as were used to excite the resonant circuit.

Such active objects need not be pen shaped, and, when shaped or used other than as a pen, such objects are often called tags or tokens. It is known to use a plurality of tags, with each individually sensed and identified by means of an identifying characteristic imposed on the active part of the object. Such tags may then be used, for example, in shops and libraries.

Conventional electric field sensing arrangements are not able to provide such identifying characteristics, and thus are limited to the sensing of unknown objects. A need therefore arises for an electric field sensing arrangement with extended capabilities.

In a first aspect, the present invention provides a combined passive and active object sensing system comprising a passive electric field sensing object sensing arrangement comprising at least one electric field sensing transmission electrode and at least one electric field sensing reception electrode, and an active object comprising a further electric field sensing transmission electrode, arranged such that in operation passive objects are sensed by variation in a current induced in the at least one electric field sensing reception electrode by a first electric field generated by the at least one electric field sensing transmission electrode, and the active object is sensed by variation in a current induced in the at least one electric field sensing reception electrode by a second electric field generated by the further electric field sensing transmission electrode.

The second electric field may be generated by the active object further comprising a further electric field sensing reception electrode which in operation couples into the first electric field to provide a signal which is subjected to a phase change by the active object and used to generate a phase-changed version of the first electric field as the second electric field, in which case the current induced from the first electric field may be distinguished from the current induced by the second field by virtue of the two fields being of different phase.

The second electric field may alternatively be generated by application of an alternating voltage to the further electric field sensing transmission electrode at a frequency different to that of an alternating voltage applied to generate the first electric field, in which case the current induced from the first electric field may be distinguished from the current induced by the second field by virtue of the two fields having been generated at different frequencies. Plural active objects with individual field generation frequencies may be included and distinguished by virtue of the different frequencies.

The second electric field may alternatively be generated by generating an alternating magnetic field that passes in to an inductor in the active object, the inductor thereby providing a signal which is used to generate the second electric field, in which case the current induced from the first electric field may be distinguished from the current induced by the second field by virtue of the two fields being of different phase.

Plural active objects may alternatively be allocated individual identities by using codified time modulation of the generation of the second electric fields.

In a second aspect, the present invention provides a current sensing circuit adapted to determine the above described induced currents, and to distinguish between the currents induced from the different electric fields as also described above.

In a third aspect, the present invention provides active objects (including tags, tokens, phycons and pens) adapted to generate the above described second electric fields.

Thus a combined passive and active object sensing system employing electric field sensing is described. An electric field sensing transmission electrode generates a first electric field that induces a current in an electric field sensing reception electrode. A passive object is sensed from variation in this current. An active object comprises a further electric field sensing transmission electrode and generates a second electric field. This may be generated by the active object coupling with and applying a phase shift to the first electric field. Alternatively the second electric field may be generated at a different frequency to the first electric field. The second electric field induces a current in the electric field sensing reception electrode that varies with the position of the active object. The separate currents are distinguished by virtue of their different phase or frequency.

The above described and other aspects of this invention will be apparent from and elucidated with reference to the embodiments described hereinafter.

Embodiments of the present invention will now be described, by way of example, with reference to the accompanying drawings, in which.

Figure 1:
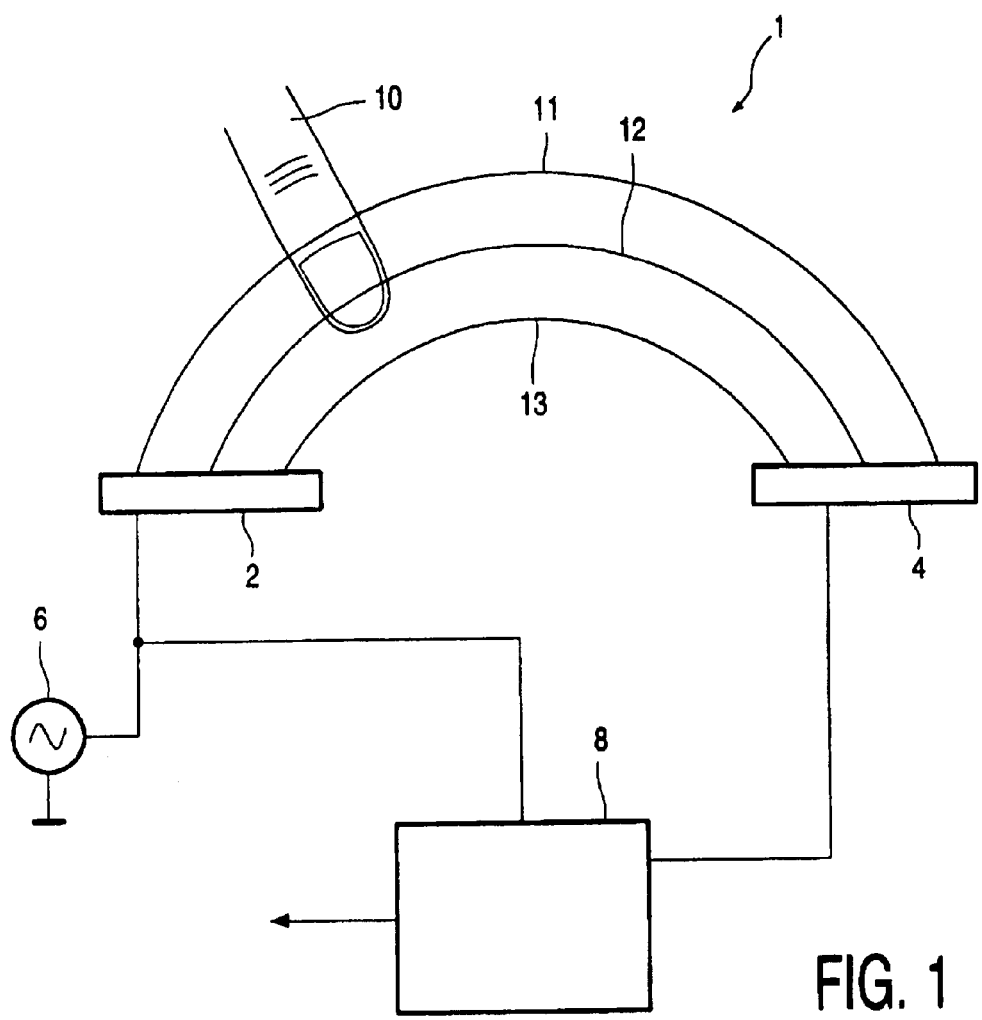
FIG. 1 shows a conventional electric field sensing system.

First, an outline account will be given of the fundamental operation of a conventional electric field sensing arrangement. FIG. 1 shows a conventional electric field sensing system 1 (not to scale) comprising an electric field sensing transmission electrode 2, an electric field sensing reception electrode 4, an alternating voltage source 6, and a current sensing circuit 8.

The alternating voltage source 6 is connected to the electric field sensing transmission electrode 2 and the current sensing circuit 8. The current sensing circuit 8 is separately connected to the electric field sensing reception electrode 4.

In operation, when an alternating voltage is applied to the electric field sensing transmission electrode 2, electric field lines are generated, of which exemplary electric field lines 11, 12, 13 pass through the electric field sensing reception electrode 4. The field lines 11, 12, 13 induce a small alternating current which is measured by the current sensing circuit 8 (the current sensing circuit 8 uses a tapped off signal from the alternating voltage to tie in with the phase of the electric field induced current, as will be described in more detail below).

When an object, in this case a user's finger 10, is placed in the vicinity of the two electrodes 2, 4, the object terminates those field lines (in the situation shown in FIG. 1, field lines 11 and 12) that would otherwise pass through the space occupied by the object, thus reducing the current flowing from the electric field sensing reception electrode 4. Thus the current level measured by the current sensing circuit may be used as a measure of the presence of an object in the vicinity of the two electrodes 2, 4.

Figure 2:
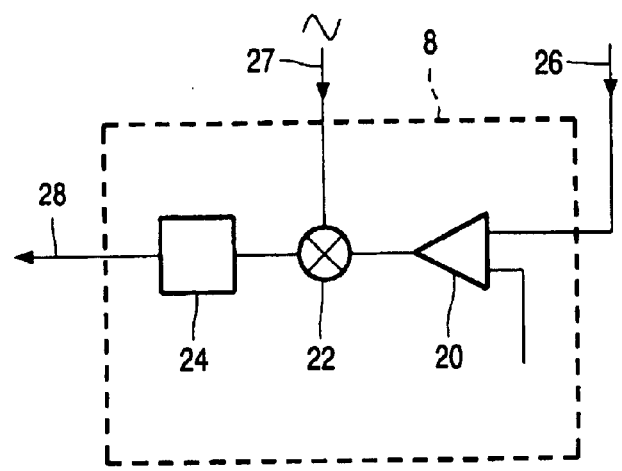
FIG. 2 is a block diagram showing functional modules of a conventional current sensing circuit of the system of FIG. 1.

FIG. 2 is a block diagram showing functional modules of the conventional current sensing circuit 8. The current sensing circuit 8 comprises an amplifier 20, multiplier 22 and a low-pass filter 24. These functional modules may be implemented in any suitable form, for example using the circuit design disclosed in U.S. Pat. No. 6,025,726, the contents of which are contained herein by reference.

In operation, the displacement current 26 induced in the electric field sensing reception electrode 4 is amplified by the amplifier 20 and multiplied by the multiplier 22 with a tapped-off and phase shifted (by a phase shift module that is not shown) version 27 of the voltage applied to the electric field sensing transmitting electrode 2. The tapped-off voltage is phase shifted so as to render the phase the same as that of the displacement current 26. Thus, if we assume here that the amplifier 20 is ideal, i.e. does not introduce any additional phase shifts to the displacement current 26, then the phase of the tapped-off voltage is shifted 90°. If, in practise, the amplifier 20 does introduce additional phase shifts to the displacement current 26, then the phase of the tapped-off voltage is adjusted as required to accommodate this.

The output from the multiplier 22 is then low-pass filtered to provide an output signal 28. The output signal 28 is thus a measure of the current induced in the electric field sensing reception electrode 4 by the electric field generated by the electric field sensing transmission electrode 2, and will vary in response to an object, e.g. the finger 10, being placed in the vicinity of the electric field sensing electrodes 2, 4. The output signal 28 is then processed by external electronics (not shown), as required.

Figure 3:
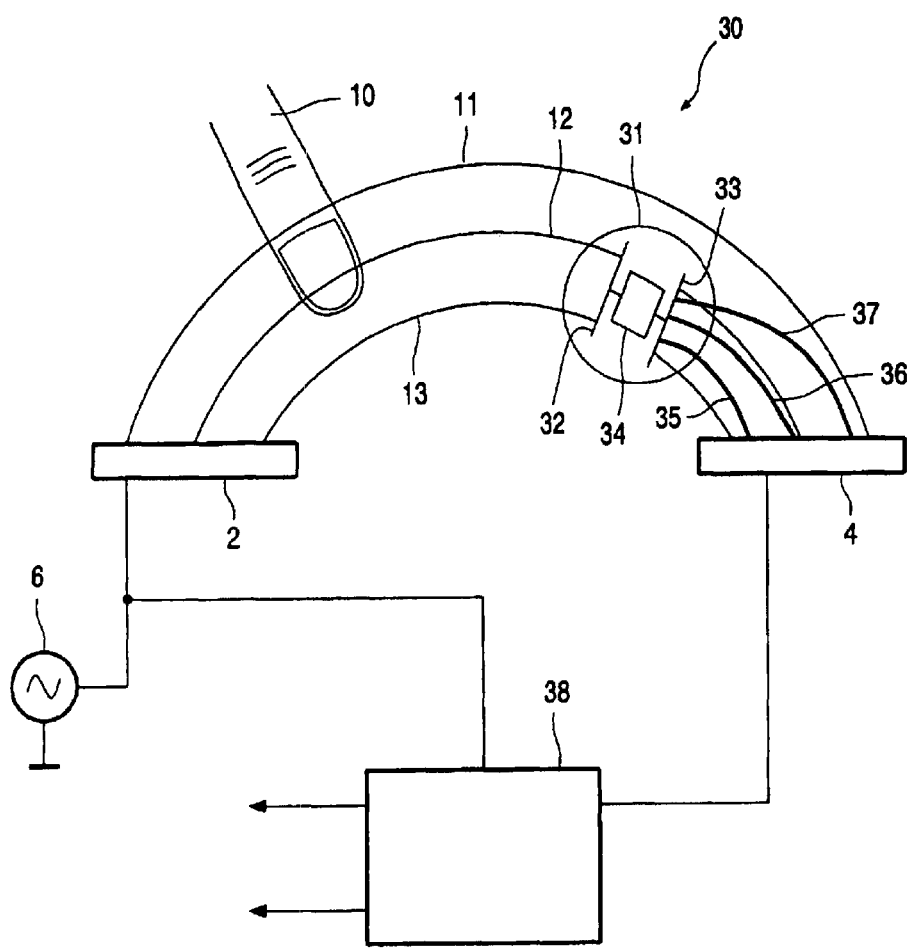
FIG. 3 shows an object sensing system according to a first embodiment of the present invention.

FIG. 3 shows an object sensing system 30 (not to scale) according to a first embodiment of the present invention. The same reference numerals as were used in FIG. 1 are used for those parts that are implemented in the same way as in the conventional object sensing system 1. In addition to the electric field sensing transmitting electrode 2, the electric field sensing reception electrode 4, and the alternating voltage source 6, the object sensing system 30 further comprises an electric field generating object, hereinafter referred to as a tag 31. The tag 31 comprises a housing, a tag electric field sensing reception electrode 32, a tag electric field sensing transmission electrode 33, and a tag circuit 34 coupled to these two electrodes. The tag electric field sensing reception electrode 32 is shielded from the tag electric field sensing transmission electrode 33 so as to avoid feedback between the two electrodes. The housing is sufficiently conducting to complete a connection or coupling from the tag circuit 34 to earth via the surfaces and items the tag 31 is to be in contact with in use. This may include a user's hand when the tag is to be held by a user. The degree of conductivity required for the housing may be chosen according to intended use of the tag 31, and will also be able to be varied as required according to the effectiveness of the tag circuit 34 and the other items making up the object sensing system 30. In this example the housing is made partially of plastic and partially of metal. As coupling may be capacitive, the metal may be covered with a thin insulating coating, e.g. paint, for aesthetic or marking purposes. The tag circuit 34 further comprises a power supply, for example a small battery.

The object sensing system 30 further comprises a current sensing circuit 38 (instead of the above described conventional current sensing circuit 8).

Objects such as the finger 10 are sensed in the same way as for the above described conventional object sensing system 1. Additionally, the tag 31 is sensed as follows. When the tag 31 is placed in the vicinity of the electric field sensing transmitting electrode 2, the tag electric field sensing reception electrode 32 couples into the electric field 11, 12, 13 being generated by the electric field sensing transmission electrode 2 to produce a received signal. The tag circuit 34 amplifies this received signal and applies a 90° phase shift thereto. The tag circuit 34 then places the phase-shifted and amplified signal on to the tag electric field sensing transmitting electrode 33 so as to generate a further electric field, represented in FIG. 3 by field lines 35, 36, 37, that is 90° out of phase with the original electric field 11, 12, 13 generated by the electric field sensing transmission electrode 2. The field lines 35, 36, 37 generated by the tag 31 pass through the electric field sensing reception electrode 4, inducing a further small alternating current which is also measured by the current sensing circuit 38, as will now be described with reference to FIG. 4.

Figure 4:
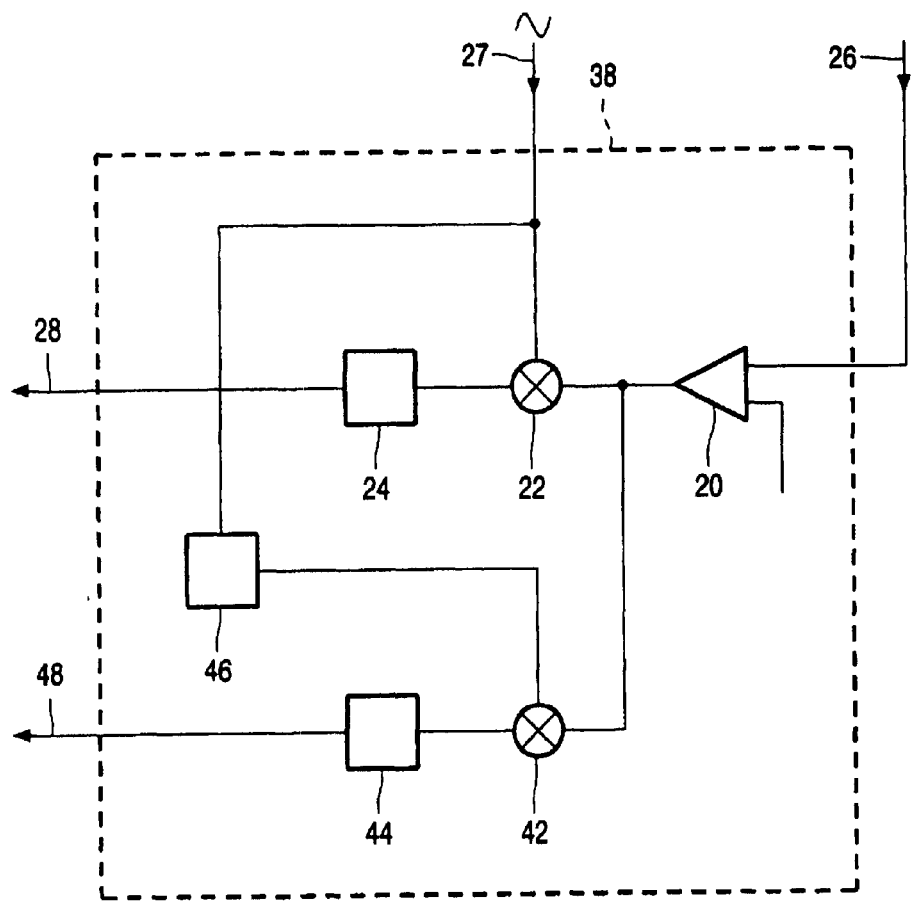
FIG. 4 is a block diagram showing functional modules of a current sensing circuit of the system of FIG. 3.

FIG. 4 is a block diagram showing functional modules of the current sensing circuit 38. The same reference numerals as were used in FIG. 2 are used for those parts that are implemented in the same way as in the conventional current sensing circuit 8. In addition to the amplifier 20, multiplier 22 and a low-pass filter 24, the current sensing circuit 38 further comprises a second multiplier 42, a second low-pass filter 44, and a phase shift module 46. These functional modules may again be implemented in any suitable form. In operation, the displacement current 26 induced in the electric field sensing reception electrode 4 is again amplified by the amplifier module 20. The amplified output from the amplifier module 20 is split and passed to each of the multipliers 22, 42.

The multiplier 22 multiples the amplified current with a tapped-off and 90° phase shifted version 27 of the voltage applied to the electric field sensing transmitting electrode 2, and the resulting multiplied signal is then low-pass filtered by the low-pass filter 24 to provide a first output signal 28. This first output signal 28, which is the same as the output signal in the conventional arrangement, is thus a measure of the current induced in the electric field sensing reception electrode 4 by the electric field generated by the electric field sensing transmission electrode 2, and will vary in response to an object, e.g. the finger 10, being placed in the vicinity of the electric field sensing electrodes 2, 4.

The tapped-off and 90° phase shifted version 27 of the voltage applied to the electric field sensing transmitting electrode 2 is also fed to the phase shift module 46, and the phase shift module applies a 90° phase shift. The multiplier 42 multiplies the amplified current signal with the resulting version of the tapped-off voltage, and the resulting multiplied signal is then low-pass filtered by the low-pass filter 44 to provide a second output signal 48. This second output signal 48 is thus a measure of the current induced in the electric field sensing reception electrode 4 by the electric field 35, 36, 37 generated by the tag electric field sensing transmission electrode 33, and will vary according to the position of the tag 31 relative to the electric field sensing reception electrode 4.

The output signals 28 and 48 are then processed by external electronics (not shown), as required.

In the circuit shown in FIG. 4, two processing channels are formed, the first channel comprising the first multiplier 22 and the first low-pass filter 24, the second channel comprising the second multiplier 42 and the second low-pass filter 44. As an alternative to two such processing channels, a single processing channel may be employed in time multiplexed fashion, by switching the phase reference input between a 0° phase and a 90° phase.

Figure 5:
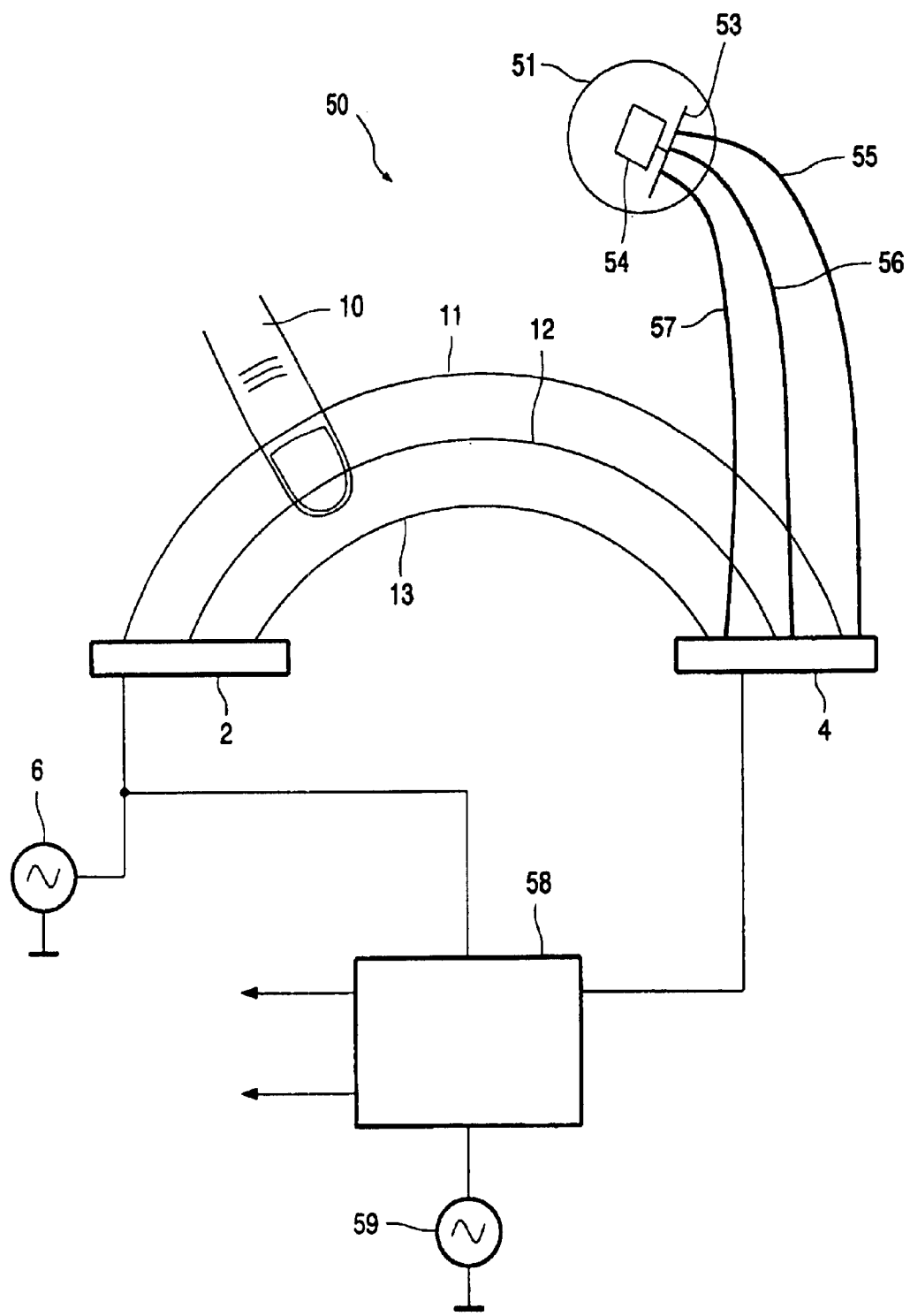
FIG. 5 shows an object sensing system according to a second embodiment of the present invention.

FIG. 5 shows an object sensing system 50 (not to scale) according to a second embodiment of the present invention. The same reference numerals as were used in FIGS. 1 and 3 are used for those parts that are implemented in the same way as in the conventional object sensing system 1. In addition to the electric field sensing transmitting electrode 2, the electric field sensing reception electrode 4, and the alternating voltage source 6, the object sensing system 50 further comprises an electric field generating object, hereinafter referred to as a tag 51. The tag 51 comprises a housing, a tag electric field sensing transmission electrode 53, and a tag circuit 54 coupled to this electrode and to the housing. The housing is sufficiently conducting to complete a connection or coupling from the tag circuit 54 to earth via the surfaces and items the tag 51 is to be in contact with in use. This may include a user's hand when the tag is to be held by a user. The degree of conductivity required for the housing may be chosen according to intended use of the tag 51, and will also be able to be varied as required according to the effectiveness of the tag circuit 54 and the other items making up the object sensing system 50. In this example the housing is made partially of plastic and partially of metal. As coupling may be capacitive, the metal may be covered with a thin insulating coating, e.g. paint, for aesthetic or marking purposes. The tag circuit 54 further comprises a power supply, for example a small battery.

The object sensing system 50 further comprises a current sensing circuit 58 (instead of the above described conventional current sensing circuit 8), and an alternating voltage source 59 to provide an alternating voltage to the current sensing circuit 58.

Objects such as the finger 10 are sensed in the same way as for the above described conventional object sensing system 1. Additionally, the tag 51 is sensed as follows. The tag circuit 54 comprises an alternating voltage source that generates an alternating voltage at a frequency, $f_2$ say, different to the frequency, $f_1$ say, of the alternating voltage source 6. Moreover, the frequency $f_2$ of the alternating voltage source of the tag circuit 54 is the same as the frequency of the alternating voltage source 59. The tag circuit 54 applies the alternating voltage of frequency $f_2$ to the tag electric field sensing transmitting electrode 53 so as to generate an electric field, represented in FIG. 5 by field lines 55, 56, 57. When the tag 51 is placed in the vicinity of the electric field sensing reception electrode 4, the field lines 55, 56, 57 generated by the tag 51 pass through the electric field sensing reception electrode 4, inducing a further small alternating current which is also measured by the current sensing circuit 58, as will now be described with reference to FIG. 6.

Figure 6:
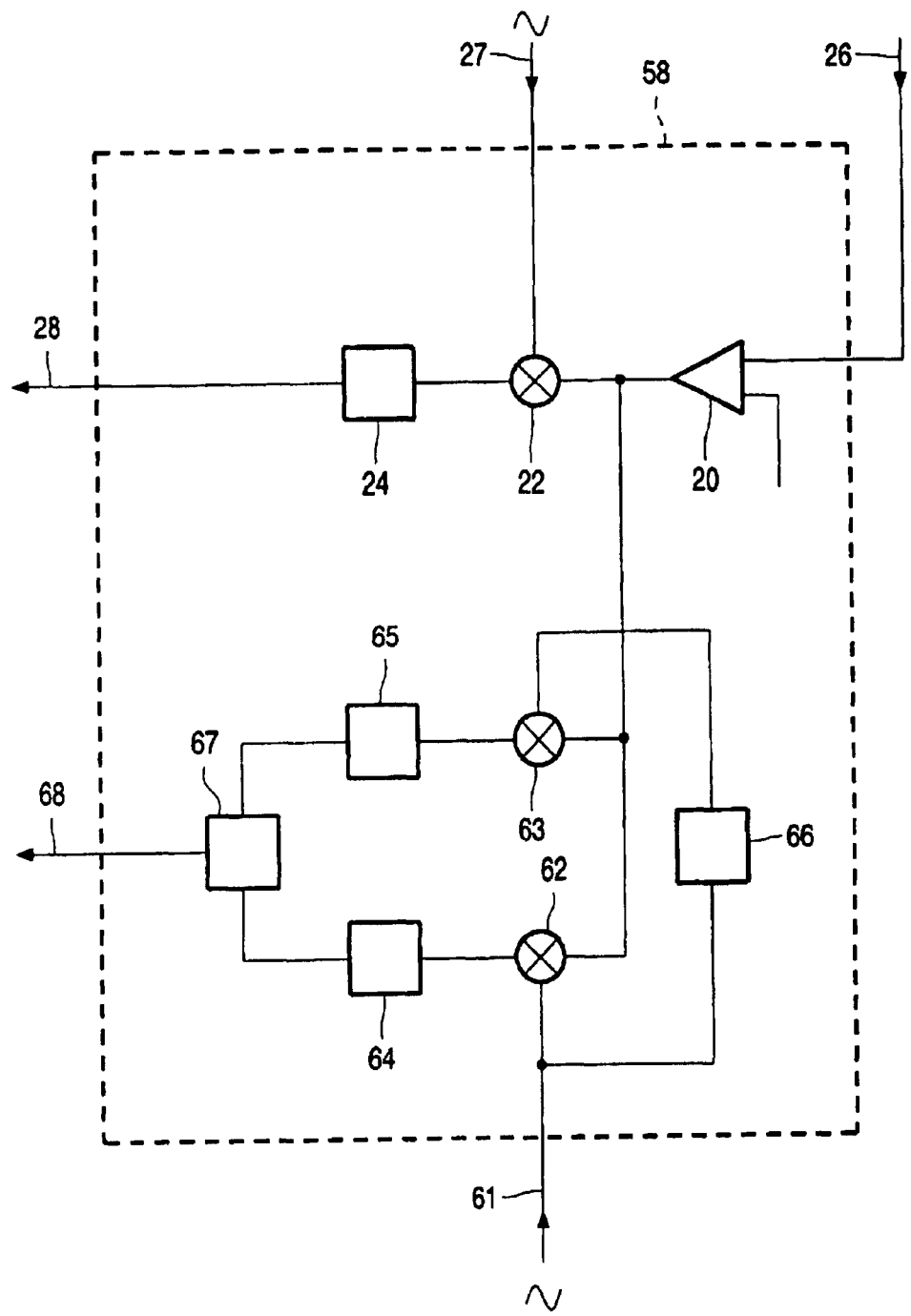
FIG. 6 is a block diagram showing functional modules of a current sensing circuit of the system of FIG. 5.

FIG. 6 is a block diagram showing functional modules of the current sensing circuit 58. The same reference numerals as were used in FIG. 2 are used for those parts that are implemented in the same way as in the conventional current sensing circuit 8. As with the above described current sensing circuits 8, 38, this current sensing circuit 58 comprises an amplifier 20, multiplier 22 and a low-pass filter 24 (this multiplier 22 and low-pass filter 24 forming a first processing channel, for processing the electric field 11, 12, 13 generated by the electric field sensing transmission electrode 2). The current sensing circuit 58 further comprises a second processing channel, for processing the electric field 55, 56, 57 generated by the tag electric field sensing transmission electrode 53 of the tag 51. Because there is no fixed phase relationship between the alternating voltage source of the tag circuit 54 and the alternating voltage source 59 providing a reference frequency to the current sensing circuit 58, the second processing channel must be able to operate without such a tie-in, and hence in this example employs quadrature detection. The second processing channel therefore itself has two separate channels in which the reference voltage is provided at two phases 90° out of phase with each other. More particularly, the second processing channel comprises a multiplier 62 with an associated low-pass filter 64, a further multiplier 63 with an associated low-pass filter 65, and a phase shift module 66 provided so as to provide a 90° phase shift to the signal 61 from the alternating voltage source 59 prior to its application to the further multiplier 63. These functional modules may again be implemented in any suitable form. In operation, the displacement current 26 induced in the electric field sensing reception electrode 4 is again amplified by the amplifier module 20. The amplified output from the amplifier module 20 is split and passed to each of the multipliers 22, 62, 63.

The multiplier 22 multiples the amplified current with a tapped-off and 90° phase shifted version 27 of the voltage (frequency $f_1$) applied to the electric field sensing transmitting electrode 2, and the resulting multiplied signal is then low-pass filtered by the low-pass filter 24 to provide a first output signal 28. This first output signal 28, which is the same as the output signal in the conventional arrangement, is thus a measure of the current induced in the electric field sensing reception electrode 4 by the electric field generated by the electric field sensing transmission electrode 2, and will vary in response to an object, e.g. the finger 10, being placed in the vicinity of the electric field sensing electrodes 2, 4.

The multiplier 62 multiplies the amplified current signal with the signal 61 (frequency $f_2$) from the alternating voltage source 59, and the resulting multiplied signal is then low-pass filtered by the low-pass filter 64. The multiplier 63 multiplies the amplified current signal with the 90° phase shifted form of the signal 61 (frequency $f_2$) from the alternating voltage source 59, and the resulting multiplied signal is then low-pass filtered by the low-pass filter 65. The respective low-pass filtered signals from the low-pass filters 64, 65 are quadrature combined by the quadrature combiner module 67 to provide a second output signal 68. This second output signal 68 is thus a measure of the current induced in the electric field sensing reception electrode 4 by the electric field 55, 56, 57 generated by the tag electric field sensing transmission electrode 53, and will vary according to the position of the tag 51 relative to the electric field sensing reception electrode 4.

The output signals 28 and 68 are then processed by external electronics (not shown), as required.

Again, where processing channels are duplicated, e.g. the two parts of the quadrature arrangement, or even the quadrature arrangement and the original first processing channel, single paths may be employed instead using time multiplexing, with appropriate switching of the phase reference inputs and/or frequency.

Broadly speaking, this second embodiment allows simpler electronics in the tag compared to the first embodiment, but at a cost of more complicated electronics in the current sensing circuit. Also, the need to shield the two electric field sensing electrodes, as was the case for the tag of the first embodiment, is avoided.

Figure 7:
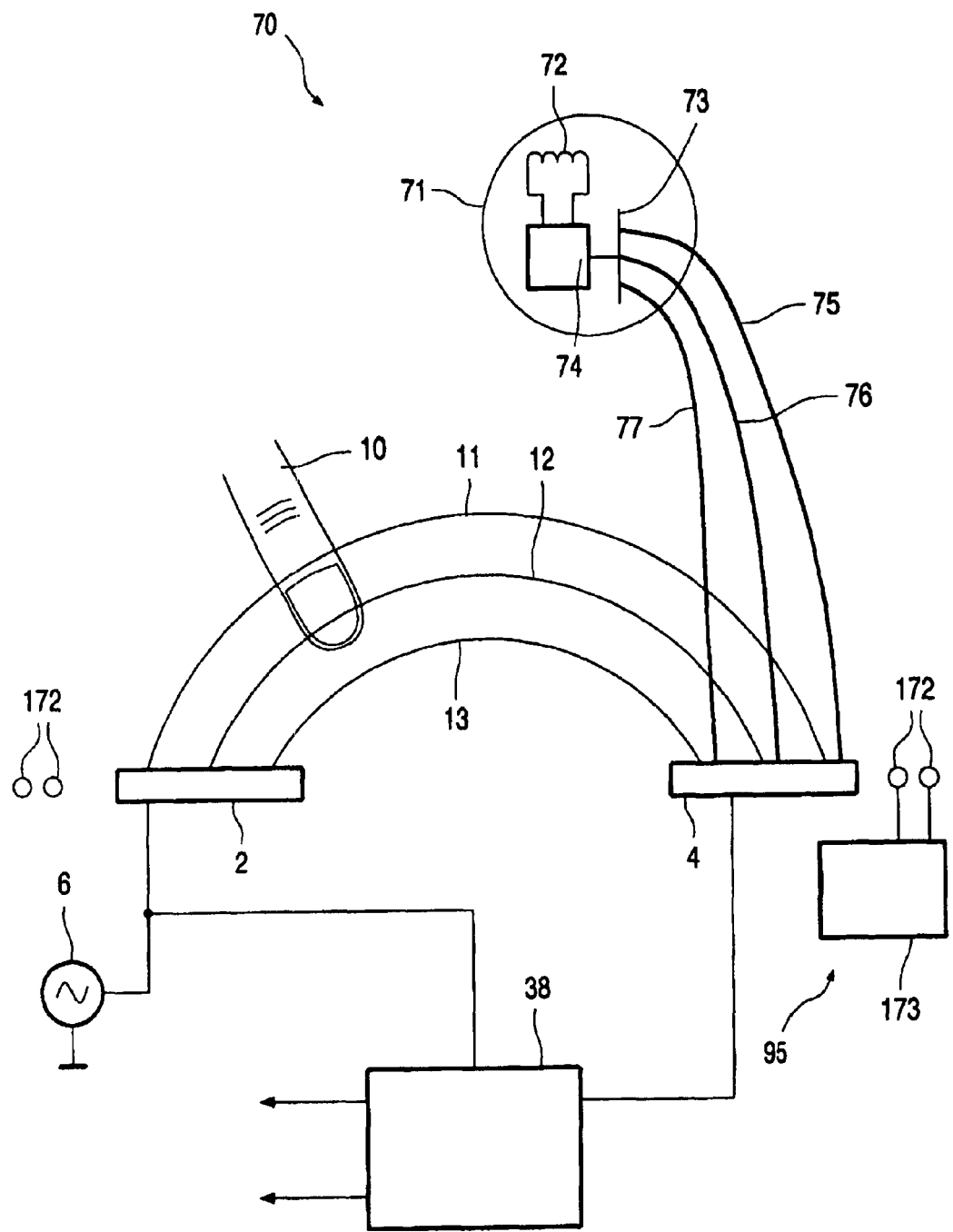
FIG. 7 shows an object sensing system according to a third embodiment of the present invention.

FIG. 7 shows an object sensing system 70 (not to scale) according to a third embodiment of the present invention. The following items are the same as the items with the same reference numerals as described for the previous embodiments: the electric field sensing transmission electrode 2, the electric field sensing reception electrode 4, the alternating voltage source 6, and the current sensing circuit 38 (as used in the first embodiment). The object sensing system 70 further comprises an electric field generating object, hereinafter referred to as a tag 71.

The tag 71 comprises a housing, an electric field sensing transmission electrode 73, and a tag circuit 74 coupled to this electrode and to the housing. The housing is sufficiently conducting to complete a connection or coupling from the tag circuit 74 to earth via the surfaces and items the tag 71 is to be in contact with in use. This may include a user's hand when the tag is to be held by a user. The degree of conductivity required for the housing may be chosen according to intended use of the tag 71, and will also be able to be varied as required according to the effectiveness of the tag circuit 74 and the other items making up the object sensing system 70. In this example the housing is made partially of plastic and partially of metal. As coupling may be capacitive, the metal may be covered with a thin insulating coating, e.g. paint, for aesthetic or marking purposes. The tag circuit 74 further comprises a power supply, for example a small battery.

The tag 71 further comprises an inductor 72 connected to the tag circuit 74.

The object sensing system 70 further comprises a coil 172 (or loop) of conducting material. The coil 172 is coupled to a drive circuit 173. In combination, the coil 172 and the drive circuit 173 provide an electromagnetic field generator 95 (i.e. magnetic field generator).

Objects such as the finger 10 are sensed in the same way as for the above described conventional object sensing system 1. Additionally the tag 71 is sensed as follows.

The drive circuit 173 drives the coil 172 such that the coil 172 generates an alternating magnetic field. The alternating magnetic field induces a current in the inductor 72. This current is amplified and phase shifted by the tag circuit 74. The tag circuit 74 then places the phase-shifted and amplified signal on to the tag electric field sensing transmitting electrode 73 so as to generate a further electric field, represented in FIG. 7 by field lines 75, 76, 77, that is 90° out of phase with the original electric field 11, 12, 13 generated by the electric field sensing transmission electrode 2. The field lines 75, 76, 77 generated by the tag 71 pass through the electric field sensing reception electrode 4, inducing a further small alternating current.

This further alternating current is measured by the current sensing circuit 38 in the same way as the corresponding current was measured by the same current sensing circuit 38 in the first embodiment (i.e. as described above with reference to FIG. 4).

In this embodiment, the drive circuit 173 generates the alternating magnetic field with the same phase as that of the electric field 11, 12, 13 generated at the electric field sensing transmission electrode 2. The tag circuit 74 therefore applies a 90° phase shift to the current induced in the inductor 72, so that the electric field 75, 76, 77 generated at the tag electrode 73 is 90° out of phase with the electric field 11, 12, 13 generated at the electric field sensing transmission electrode 2, so that the current sensing circuit 38 may distinguish these two fields, and hence between the finger 10 and the tag 71, by virtue of their different phases, as described above. This approach has the advantage that the same phase generator may be used for driving both the electric field sensing transmission electrode 2 and the drive circuit 173. However, the required phase difference may be provided in any other convenient manner. For example, the drive circuit 173 may be arranged to generate the alternating magnetic field 90° out of phase with the electric field 11, 12, 13 generated at the electric field sensing transmission electrode 2, and in this case the tag circuit 74 does not apply any phase shift to the current induced in the inductor 72.

The drive circuit 173 may be implemented in the form of any suitable conventional alternating voltage/current source, using for example a signal generator. The drive circuit 173 is arranged such that it drives the coil 172 with alternating current, in phase (or with some other known relative phase relationship) with the alternating voltage source 6 driving the electric field sensing transmission electrode 2.

The currents produced in the electric field sensing reception electrode 4 by the electric field generated by the coil 172 (a potential form of interference) are effectively (or at least substantially) filtered out by the current sensing circuit 38.

Other approaches may be employed instead of, or in addition to, effectively filtering out the currents produced in the electric field sensing reception electrode 4 by the electric field generated by the coil 172 (as discussed in the preceding paragraph). One possibility is to turn the coil 172 off periodically and to measure the currents from the electric field sensing reception electrode 4 when the coil is turned off. This is readily implemented, as the signal from the coil 172 will ring down, i.e. fall away, much quicker than that from the tag 71. This is because when the coil is turned off, both ends are grounded, so there is no voltage difference across them to produce a signal.

Figure 8:
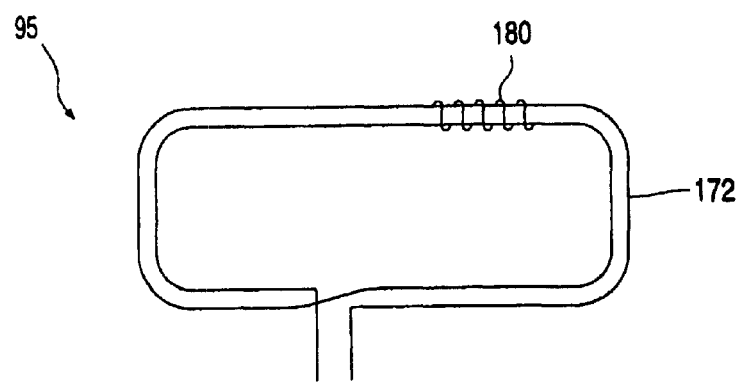
FIG. 8 is a schematic diagram showing a coil with a grounded toroidal wire around the coil.

FIG. 8 is a schematic diagram showing the coil 172 with a grounded toroidal wire 180 around the coil 172 (for clarity, only a portion of the coil 172 is shown with the toroidal wire 180 in the Figure, but in practice this will extend along the whole length of the coil 172). The toroidal wire 180 substantially shields the electric field generated by the coil 172, but does not significantly affect the magnetic field generated by the coil 172 since any edicurrents will be in a direction away from the centre of the toroid. This use of the toroidal wire 180 as a shield around the coil 172 is a preferred option implemented in this embodiment as another way to in effect filter out or reduce the occurrence of currents produced in the electric field sensing reception electrode 4 by the electric field component generated by the coil 172.

The drive circuit 173 and the current sensing circuit 38 are adapted so that the signals detected from the tag 71 are not too low to be detected at the maximum required operating distance of the tag 71 away from the electric field sensing reception electrode 4. Likewise the drive circuit 173 and the current sensing circuit 38 are adapted so that the signals detected from the tag 71 are not saturated when the tag 71 is directly against the electric field sensing reception electrode 4. This is preferably implemented by means of a dynamic adjustment arrangement, in which a feedback route is provided between the current sensing circuit 38 and the drive circuit 173, such that the voltage applied to the coil 172 is reduced as the currents sensed by the current sensing circuit 38 increases.

In this embodiment, the inductor 72 is provided to couple the alternating magnetic field to the tag circuit 74. In other embodiments, other inductance arrangements may be used.

In other embodiments, the inductor 72 may be replaced by a resonant circuit, comprising for example an inductor and a capacitor in parallel. The resonant circuit may be tuned to a single frequency used to drive the coil 172. In this case, the capacitor is preferably implemented as a thermally stable capacitor. For example, the capacitor may be implemented using two capacitors in parallel, namely a polystyrene capacitor with a thermal drift rate of 0.01% per ° C. and a 6–50 pF ceramic capacitor with a thermal drift rate of 0.03% per ° C.

In this embodiment the conducting material of the coil 172 is copper wire. In FIG. 7, for clarity, the conducting material is shown looped round twice. One preferred choice is for the material to be looped round five times. The number of times wound round and the conducting material employed are design choices that may be varied as suits.

The system 50 of the second embodiment and the system 70 of the third embodiment may be adapted by the provision of further tags. Each tag is driven at a different frequency, say $f_2$, $f_3$, $f_4$ and so on. The current processing circuit is provided with plural processing channels, each provided with a respective alternating voltage source of corresponding frequency $f_2$, $f_3$, $f_4$ and so on, as required. Again, these processing channels may alternatively be provided on a time division basis. Another possibility is that, within such a system containing tags of plural different frequencies, two or more tags may have the same frequency, such that types or classes of tags may be distinguished.

In another variation, the system 30 of the first embodiment, the system 50 of the second embodiment or the system 70 of the third embodiment may be adapted by the provision of further tags using another approach. The tag circuit of each tag comprises control circuitry for systematically driving the tag electric field sensing transmission electrode on and off in a time based manner providing a time-modulated digital identity (or address) for the individual tag. The current processing circuit is provided with processing electronics for distinguishing the respective identities. Again, another possibility is that, within such a system containing tags of plural different digital identities, two or more tags may have the same identity, such that types or classes of tags may be distinguished.

In the above embodiments, the larger the signal amplitude generated by the tag circuit of the tag is made, the smaller the tag electric field sensing transmission electrode may be. As the size (area) of the tag electric field sensing transmission electrode is made smaller, the accuracy with which the position of the tag may be determined (by post-processing, in conventional manner, of the outputs) is increased. In some implementations, this may allow sensing of the tag position to be used as a pen input.

In another alternative, the tag electric field sensing transmission electrode may be shaped long and thin (or some other biased shape), and knowledge of the shape used in a system comprising multiple electric field sensing reception electrodes (and, in the case of the first embodiment, multiple electric field sensing transmission electrodes) to provide outputs from which position information may be determined.

It will be appreciated that the above described circuit functions for determining the induced currents are merely exemplary, and other ways of determining the induced currents may be employed.

The above described object sensing systems may be used in a wide variety of applications. One area of use is in interactive display applications. The tags may be employed as tokens or so-called "phycons" that the user of a display may position relative to the display to specify user input, e.g. in the form of "pen" input. Other (non-display) applications that may be considered include any application where it is useful to locate specific objects in space, ranging for example from a conductor's baton to shop merchandise.

From reading the present disclosure, other variations and modifications will be apparent to persons skilled in the art. Such variations and modifications may involve equivalent and other features which are already known in the art, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

What is claimed is:

1. An object sensing system, comprising:
  a first electric field sensing transmission electrode;
  an electric field sensing reception electrode;
  a driving circuit for driving the first electric field sensing transmission electrode so as to generate a first electric field;
  an electric field generating object including a second electric field sensing transmission electrode and means for driving the second electric field sensing transmission electrode so as to generate a second electric field; and
  a current sensing circuit for distinguishably sensing currents induced in the electric field sensing reception electrode by the first electric field and the second electric field,
  wherein the first electric field sensing transmission electrode and the electric field sensing reception electrode are arranged such that a first object placed in the vicinity of the first electric field sensing transmission electrode and the electric field sensing reception electrode causes a variation in the current induced in the electric field sensing reception electrode by the first electric field,
  and wherein the current sensing circuit is adapted to sense the first object from the variation in the current induced in the electric field sensing reception electrode by the first electric field and to sense the electric field generating object from a variation in the current induced in the electric field sensing reception electrode by the second electric field.

2. The system of claim 1, wherein the means for driving the second electric field sensing transmission electrode so as to generate a second electric field comprises:
  a reception electrode for coupling with the first electric field to generate a received signal;
  means for applying a phase shift to the received signal; and
  means for delivering the phase shifted signal to the second electric field sensing transmission electrode;
  wherein the current sensing circuit is adapted to distinguish the current induced from the first electric field from the current induced from the second electric field by virtue of the different phases of the two fields.

3. The system of claim 2, including a plurality of electric field generating objects, the driving circuit of each being adapted to drive each to generate a respective second electric field distinguishable from the other second electric fields on a time-modulated basis;
  wherein the current sensing circuit is adapted to distinguish the current induced from each of the plural electric field generating objects by virtue of the different time-modulated form of the fields from each of the electric field generating objects.

4. The system of claim 1, wherein the means for driving the second electric field sensing transmission electrode so as to generate a second electric field comprises:
  a driving circuit for driving the second electric field sensing transmission electrode so as to generate the second electric field at a frequency different to the frequency of the first electric field; and
  wherein the current sensing circuit is adapted to distinguish the current induced from the first electric field from the current induced from the second electric field by virtue of the different frequencies of the two fields.

5. The system of claim 4, comprising a plurality of electric field generating objects, the driving circuit of each being adapted to drive each to generate a respective second electric field of different frequency;
  wherein the current sensing circuit is adapted to distinguish the current induced from each of the plural electric field generating objects by virtue of the different frequencies of the fields from each of the electric field generating objects.

6. The system of claim 4, including a plurality of electric field generating objects, the driving circuit of each being adapted to drive each to generate a respective second electric field distinguishable from the other second electric fields on a time-modulated basis;
  wherein the current sensing circuit is adapted to distinguish the current induced from each of the plural electric field generating objects by virtue of the different time-modulated form of the fields from each of the electric field generating objects.

7. The system of claim 1, comprising a plurality of electric field generating objects, the driving circuit of each being adapted to drive each to generate a respective second electric field distinguishable from the other second electric fields on a time-modulated basis;
  wherein the current sensing circuit is adapted to distinguish the current induced from each of the plural electric field generating objects by virtue of the different time-modulated form of the fields from each of the electric field generating objects.

8. The system of claim 1, further comprising means for generating an alternating magnetic field; and wherein the means for driving the second electric field sensing transmission electrode so as to generate a second electric field comprises:
  an inductor for coupling with the alternating magnetic field to generate a received signal; and
  means for delivering the signal to the second electric field sensing transmission electrode;
  wherein the current sensing circuit is adapted to distinguish the current induced from the first electric field from the current induced from the second electric field by virtue of different phases of the two fields.

9. The system of claim 8, wherein shielding is provided to substantially block any electric field generated by the means for generating an alternating magnetic field and substantially allow to pass the magnetic field generated by the means for generating an alternating magnetic field.

10. The system of claim 8, wherein the current sensing circuit is adapted to substantially filter out currents produced in the electric field sensing reception electrode by electric fields generated by the means for generating an alternating magnetic field.

11. The system of claim 10, wherein the filtering out is performed using a difference in phase between the electric field generated by the means for generating an alternating magnetic field and the second electric field generated by the second electric field sensing transmission electrode.

12. The system of claim 11, wherein shielding is provided to substantially block any electric field generated by the means for generating an alternating magnetic field and substantially allow to pass the magnetic field generated by the means for generating an alternating magnetic field.

13. The system of claim 10, wherein shielding is provided to substantially block any electric field generated by the means for generating an alternating magnetic field and substantially allow to pass the magnetic field generated by the means for generating an alternating magnetic field.

14. A current sensing circuit for an electric field sensing arrangement; the current sensing circuit comprising:
 means for sensing variation in a current induced in an electric field sensing reception electrode by a first electric field; and
 means for separately sensing variation in a current induced in the electric field sensing reception electrode by a second electric field.

15. The circuit of claim 14, wherein the current sensing circuit is adapted to distinguish between the respective currents induced by the first and second electric fields by virtue of different respective phases of the two fields.

16. The circuit of claim 15, including means for separately sensing variation in respective currents induced in the electric field sensing reception electrode by a plurality of further electric fields; wherein the current sensing circuit is adapted to distinguish the respective induced currents by virtue of different respective time-modulated forms of the further electric fields.

17. The circuit of claim 14, wherein the current sensing circuit is adapted to distinguish between the respective currents induced by the first and second electric fields by virtue of different respective frequencies of the two fields.

18. The circuit of claim 17, further comprising means for separately sensing variation in respective currents induced in the electric field sensing reception electrode by a plurality of further electric fields; wherein the current sensing circuit is adapted to distinguish the respective induced currents by virtue of different respective frequencies of the further electric fields.

19. The circuit of claim 17, including means for separately sensing variation in respective currents induced in the electric field sensing reception electrode by a plurality of further electric fields; wherein the current sensing circuit is adapted to distinguish the respective induced currents by virtue of different respective time-modulated forms of the further electric fields.

20. The circuit of claim 14, further comprising means for separately sensing variation in respective currents induced in the electric field sensing reception electrode by a plurality of further electric fields; wherein the current sensing circuit is adapted to distinguish the respective induced currents by virtue of different respective time-modulated forms of the further electric fields.

21. A method of sensing objects, comprising:
 generating a first electric field using a first electric field sensing transmission electrode;
 sensing a first current induced in an electric field sensing reception electrode by the first electric field;
 sensing a first object by detecting variation in the current induced by the first electric field, the variation being caused by the first object being placed in the vicinity of the first electric field sensing transmission electrode and the electric field sensing reception electrode;
 generating a second electric field using an electric field sensing transmission electrode located in a second object;
 sensing the second object by sensing, in distinction from the first current, a second current induced in the electric field sensing reception electrode by the second electric field when the second object is placed in the vicinity of the electric field sensing reception electrode.

* * * * *